(12) United States Patent
Chandran et al.

(45) Date of Patent: Apr. 6, 2010
(10) Patent No.: US 7,691,667 B2

(54) COMPLIANT INTEGRATED CIRCUIT PACKAGE SUBSTRATE

(75) Inventors: Biju Chandran, Vienna, VA (US); Mitul Modi, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 381 days.

(21) Appl. No.: 11/475,347

(22) Filed: Jun. 27, 2006

(65) Prior Publication Data

US 2007/0296072 A1    Dec. 27, 2007

(51) Int. Cl.
*H01L 21/00* (2006.01)
(52) U.S. Cl. ............... 438/106; 438/612; 257/E21.038
(58) Field of Classification Search ............... 257/774, 257/780, 678, 787, 788, 737, 738, E23.033, 257/E23.037, E23.038, E23.04; 438/106–127, 438/612–617
See application file for complete search history.

(56) References Cited

U.S. PATENT DOCUMENTS

| 5,450,290 | A  | * | 9/1995 | Boyko et al. | 361/792 |
| 5,956,235 | A  | * | 9/1999 | Kresge et al. | 361/774 |
| 2002/0027441 | A1 | * | 3/2002 | Akram et al. | 324/754 |
| 2003/0008182 | A1 | * | 1/2003 | Saitoh et al. | 428/699 |
| 2004/0217470 | A1 | * | 11/2004 | Takano | 257/734 |

* cited by examiner

*Primary Examiner*—Brook Kebede
(74) *Attorney, Agent, or Firm*—Buckley, Maschoff & Talwalkar LLC

(57) ABSTRACT

An integrated circuit package may include a plurality of interconnects, and an integrated package substrate coupled to the plurality of interconnects and comprising an integrated circuit package substrate core. A first surface of the integrated circuit package substrate core may define a depression.

4 Claims, 7 Drawing Sheets

COMPLIANT INTEGRATED CIRCUIT PACKAGE SUBSTRATE

BACKGROUND

The core layer copper thickness of conventional integrated circuit package substrates continues to increase as such substrates are required to route increasing amounts of power. A substrate may be electrically and physically coupled to a motherboard using an array of solder balls. The motherboard, in turn, tends to flex during shock and vibration thereof, platform assembly and testing. The above-mentioned increased thickness results in increased substrate rigidity that may prevent the substrate from flexing to accommodate the motherboard flexing. The flexing mismatch results in forces on the solder balls which may decrease their reliability.

Conventional techniques to address the foregoing include increasing a solder ball pad size on the substrate and on the motherboard. Other techniques include designing a substrate such that its corner solder balls, which tend to experience the greatest flexing forces, are sacrificial (i.e., not critical to electrical function). The former technique may increase a package footprint, and the latter technique reduces I/O density. Notwithstanding their effectiveness in addressing the above issues, the trade-offs presented by these techniques may unacceptable in any number of usage scenarios.

DETAILED DESCRIPTION

Figure 1:
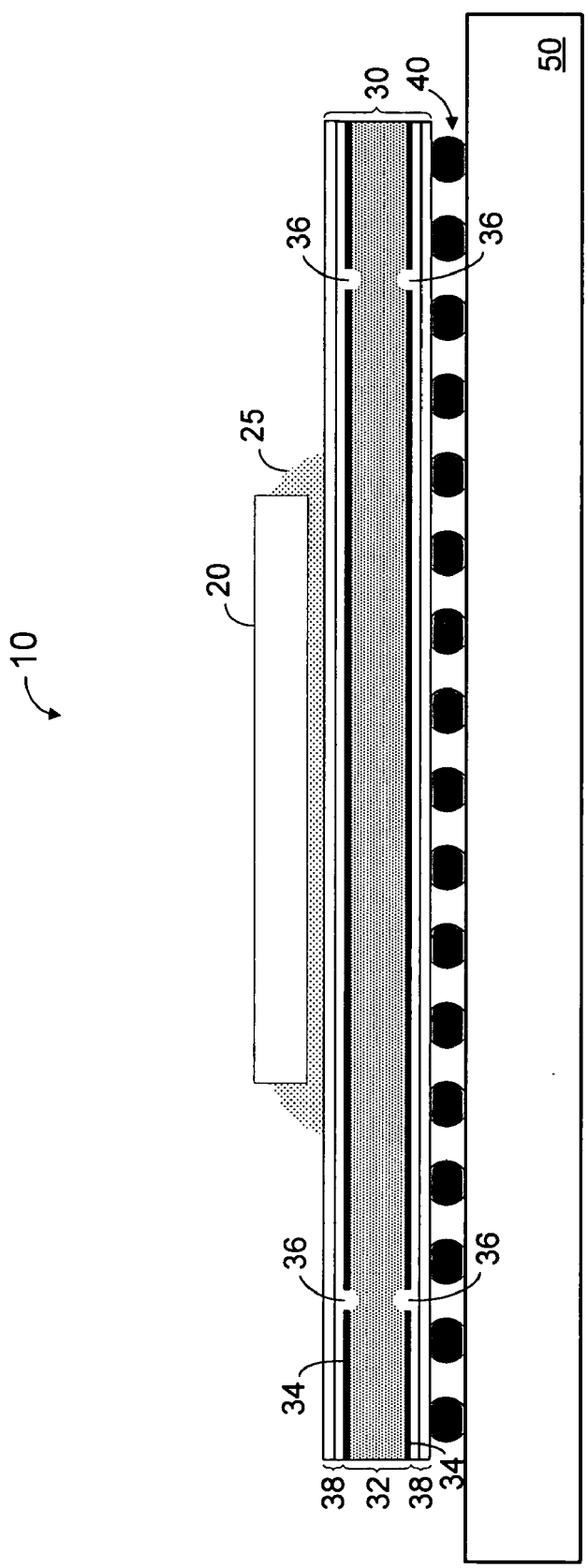
FIG. 1 is a side cross-sectional view of an apparatus according to some embodiments.

FIG. 1 is a cross-sectional side view of apparatus 10 according to some embodiments. Apparatus 10 includes integrated circuit die 20, integrated circuit package substrate 30, interconnects 40, and motherboard 50. In some embodiments, substrate 30 complies to some degree with flexing of motherboard 50 so as to reduce resulting forces on interconnects 40.

Integrated circuit die 20 may include integrated electrical devices for providing microprocessor functionality and may be fabricated using any suitable materials and fabrication techniques. The electrical devices may reside between a substrate of integrated circuit die 20 and integrated circuit package substrate 30 in a "flip-chip" arrangement. In some embodiments, integrated circuit die 20 comprises an Intel Pentium® microprocessor having a silicon substrate.

Underfill material 25 encapsulates the electrical coupling between integrated circuit die 20 and integrated circuit package substrate 30. Integrated circuit package substrate 30 may comprise any ceramic, organic, and/or other suitable material, including but not limited to an organic laminated glass-weave polymer. Integrated circuit package substrate 30 provides physical support to die 30 and also provides routing of power and signals between die 20 and motherboard 50.

Substrate 30 includes integrated circuit package substrate core 32. Core 32 may comprise an inner core layer composed of a fiber-reinforced material (e.g., bismaleimide triazine (BT) or FR4), and outer core layer 34 comprising a metal. In some embodiments, outer core layer 34 comprises copper, and/or comprises an upper surface and a lower surface of core 32.

Build-up layers 38 may be fabricated on core 32. Layers 38 may comprise conductive layers separated by dielectric layers. The conductive layers comprise reference planes for supplying reference voltages to electrical components that are connected to substrate 30, or routing layers including conductive traces for carrying electrical signals between such electrical components.

FIG. 1 illustrates depressions 36 defined by core 32. Depressions 36 of substrate 30 comprise regions of outer core layer 34 in which the material of outer core layer 34 is not present. In the illustrated embodiment, depressions 36 extend through outer core layer 34 and into the inner core layer. Also in the illustrated embodiment, depressions 36 defined by a lower surface of core 32 substantially mirror depressions 38 defined by an upper surface of core 32. Depressions 36 may be filled with dielectric material deposited during fabrication of build-up layers 38.

Solder balls 40 are coupled to motherboard 50 to carry power and other electrical signals between package substrate 30 and motherboard 50. For example, one or more of solder balls 40 may be coupled to conductive elements of substrate 30 and in turn to conductive elements of die 20. Solder balls 40 may be mountable directly to a motherboard as shown or onto an interposer (not shown) that is in turn mounted directly to a motherboard. Alternative interconnects such as through-hole pins may be used instead of solder balls 40 to mount substrate 30 to a motherboard, a socket, or another substrate.

Figure 2:
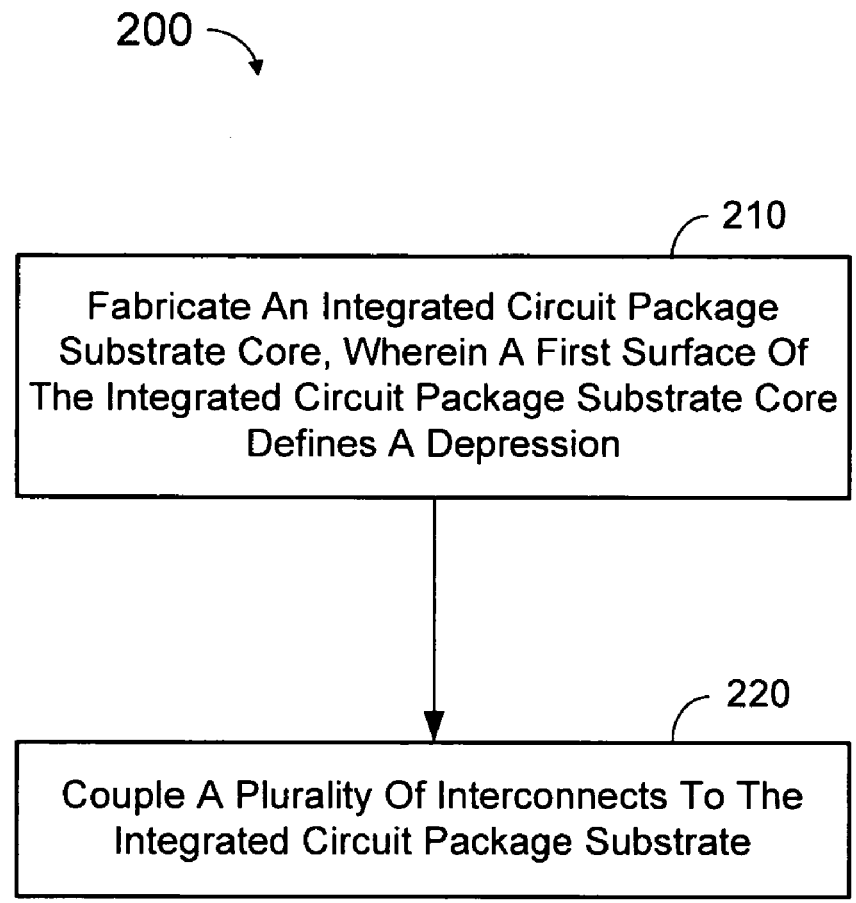
FIG. 2 is a diagram of a process to fabricate an apparatus according to some embodiments.

Process 200 of FIG. 2 may be used to fabricate an apparatus according to some embodiments. Process 200 may be performed by any system or systems, and one or more aspects may be performed manually. Moreover, aspects of process 200 may be performed by different entities (e.g., companies).

An integrated circuit package substrate core is fabricated at 210. A first surface of the core defines a depression. Briefly, 210 may comprise fabricating a core using conventional methods, and then milling or etching out material from at least one surface of the core to define a depression.

Next, at 220, a plurality of interconnects are coupled to the integrated circuit package substrate. The interconnects may comprise solder balls 40 of FIG. 1, and may be coupled to substrate 30 using any method that is or becomes known. According to some embodiments, the depressions fabricated at 210 may relieve forces of solder balls 40 during flexing of a device to which solder balls 40 are coupled.

Figure 3A:
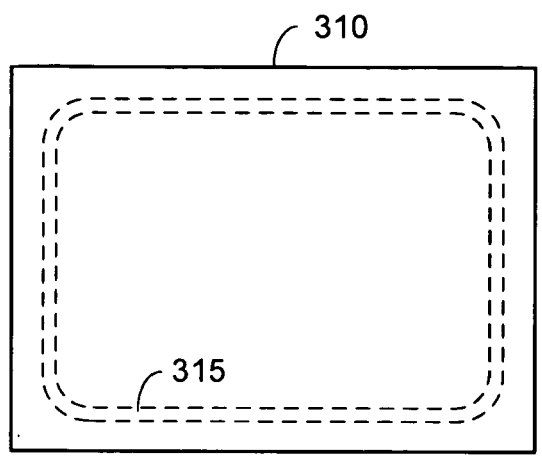
FIGS. 3A through 3C comprise top views of integrated circuit substrate cores according to some embodiments.
Figure 3B:
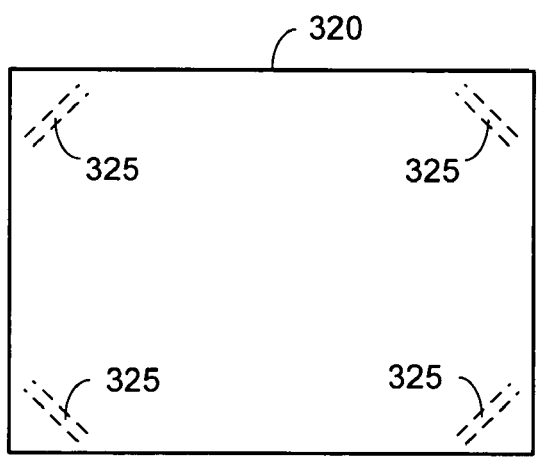
Figure 3C:
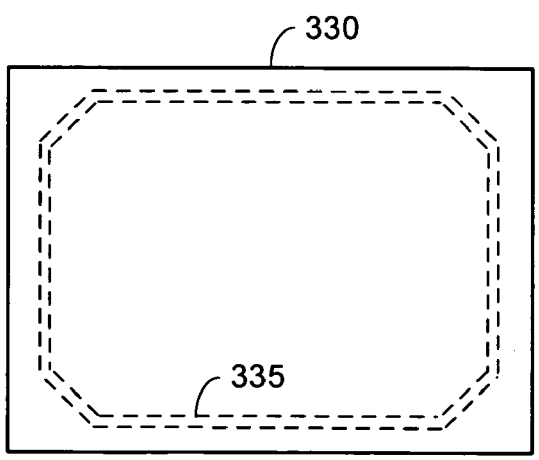

FIGS. 3A through 3C comprise top views of various integrated circuit substrate cores according to some embodiments. Each of substrate cores 310 through 330 includes a surface defining at least one depression. More particularly, depression 315 of core 310 comprises a continuous loop substantially following a periphery of core 310.

Depressions 315 of core 320 are disposed adjacent to corners of core 320. As such, depressions 315 may facilitate flexing of the corners. Depression 335 of core 330 comprises a continuous loop following a periphery of core 330, and is also disposed adjacent to corners so as to facilitate flexing of the corners. A core according to some embodiments may define one or more depressions in any layout or configuration.

Figure 4:
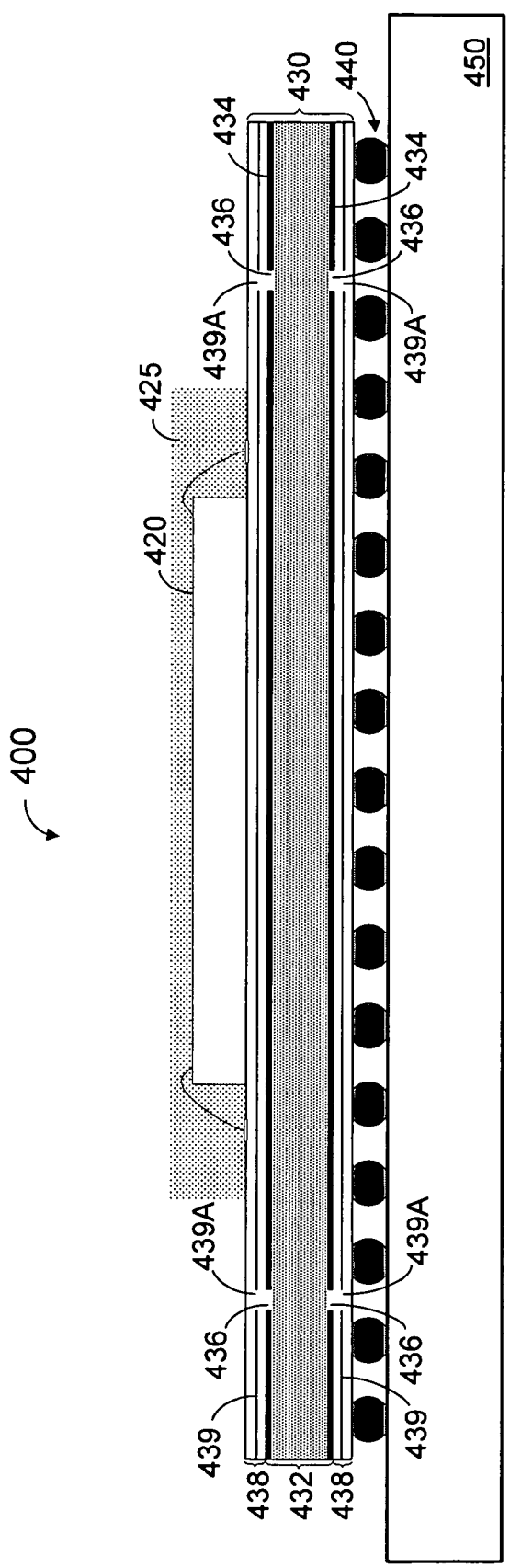
FIG. 4 is a side cross-sectional view of an apparatus according to some embodiments.

FIG. 4 is a side cross-sectional view of system 400. System 400 comprises integrated circuit die 420 that is wirebonded to integrated circuit package substrate 430. According to conventional designs, die 420 is encapsulated by mold compound 425.

Integrated circuit package substrate 430 comprises integrated circuit package substrate core 432, which in turn includes outer metal layers 434. As shown, upper and lower surfaces of core 432 define depressions 436. In contrast to core 32 of FIG. 1, depressions 436 extend through outer metal layers 434 and not into an inner layer of core 432. Moreover build up layers 438 include power planes 439, each of which includes a non-conductive area 439A. Each non-conductive area 439A is disposed in relation to a depression 436 to further facilitate flexing of integrated circuit substrate core 430.

Figure 5:
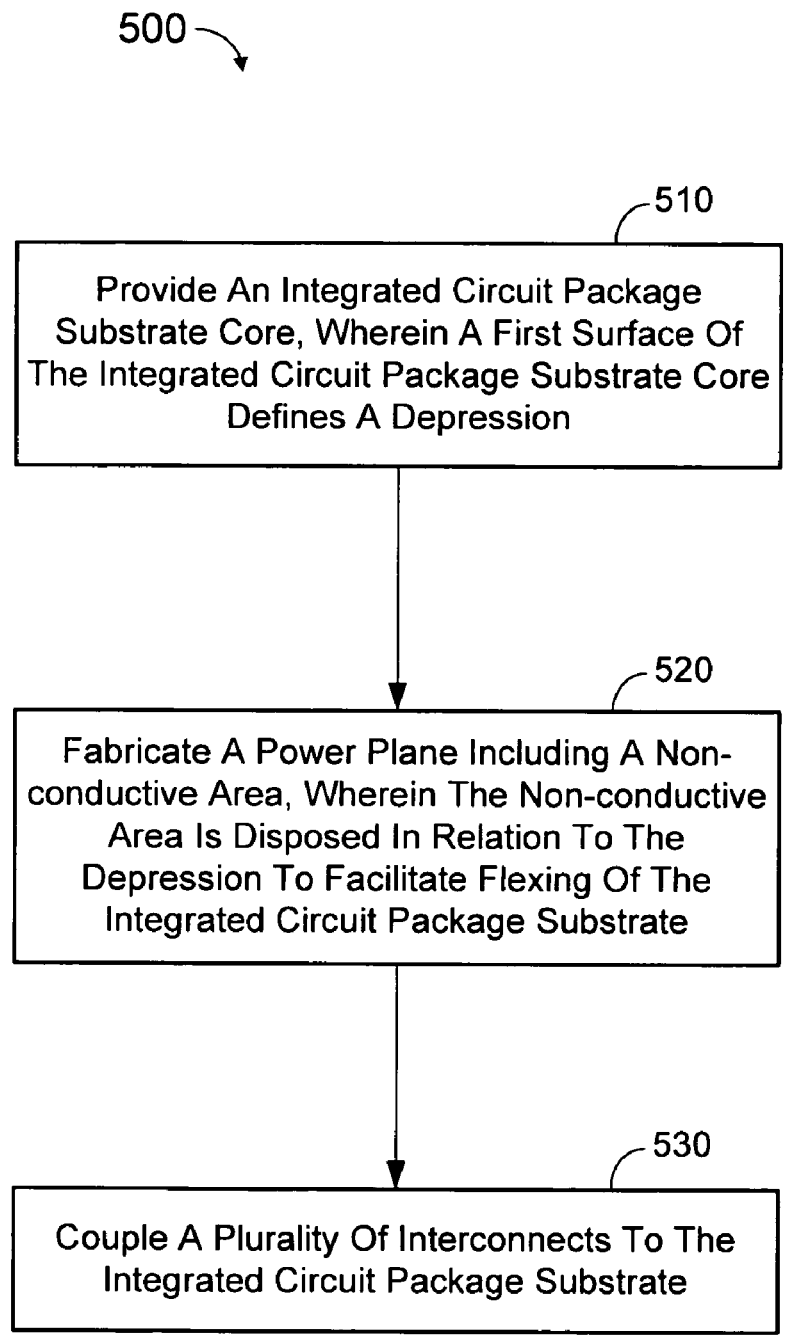
FIG. 5 is a diagram of a process to fabricate an apparatus according to some embodiments.

Process 500 of FIG. 5 may be used to fabricate an apparatus according to some embodiments. Process 500 may be performed by any system or systems, and one or more aspects may be performed manually. Aspects of process 500 may be performed by different entities (e.g., companies).

Initially, at 510, an integrated circuit package substrate core is provided, wherein a first surface of the core defines a depression. The core may simply be purchased from a manufacturer at 510, or may be manufactured at 510. The depressions may be manufactured by laser, by mechanical milling, by etching out material via photolithographic techniques, or by other manners.

Figure 6A:
FIGS. 6A through 6C illustrate fabrication of an apparatus according to some embodiments.

FIG. 6A is a cross-sectional side view of integrated circuit package substrate core 632 that may be provided according to some embodiments of 510. Core 632 includes inner layer 633 of fiber-reinforced dielectric material and copper outer layers 633. Both upper and lower surfaces of core 632 define depressions 636. As described with respect to depressions 436 of FIG. 4, depressions 636 extend through outer layers 634 and not into inner layer 633.

Figure 6B:
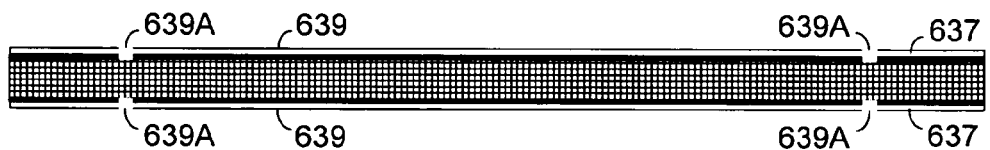

A power plane is fabricated at 520. The power plane includes a non-conductive area that is disposed in relation to the depressions so as to facilitate flexing of the integrated circuit package substrate. FIG. 6B illustrates core 632 after 520. As shown, dielectric layers 637 have been fabricated upon outer layers 634 and power planes 639 have been fabricated upon dielectric layers 637. Power planes 639 include non-conductive areas 639A that spatially coincide with depressions 636. Such an arrangement may facilitate flexing of an integrated circuit package substrate composed of core 632. In some embodiments, any metal planes or layers of such an integrated circuit package substrate may include non-conductive areas designed to facilitate flexing of the integrated circuit package substrate.

Next, at 530, a plurality of interconnects are coupled to the integrated circuit package substrate. The interconnects may comprise solder balls, and may be coupled to the substrate using any method that is or becomes known. Continuing the present example, FIG. 6C shows solder balls 640 after coupling thereof to the apparatus of FIG. 6B.

Figure 6C:
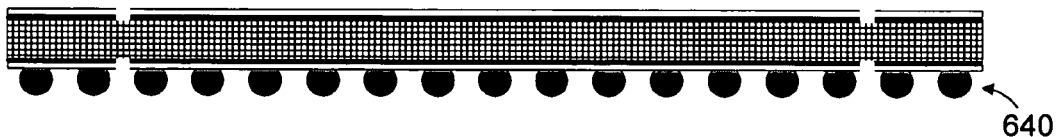

Of course the substrate of FIG. 6C may be fabricated according to any current or future system. For example, areas 639 may be etched after fabrication of plane 639 or may be defined during fabrication of plane 639. In addition, embodiments are not limited to the particular construction shown in FIGS. 6A through 6C.

Figure 7:
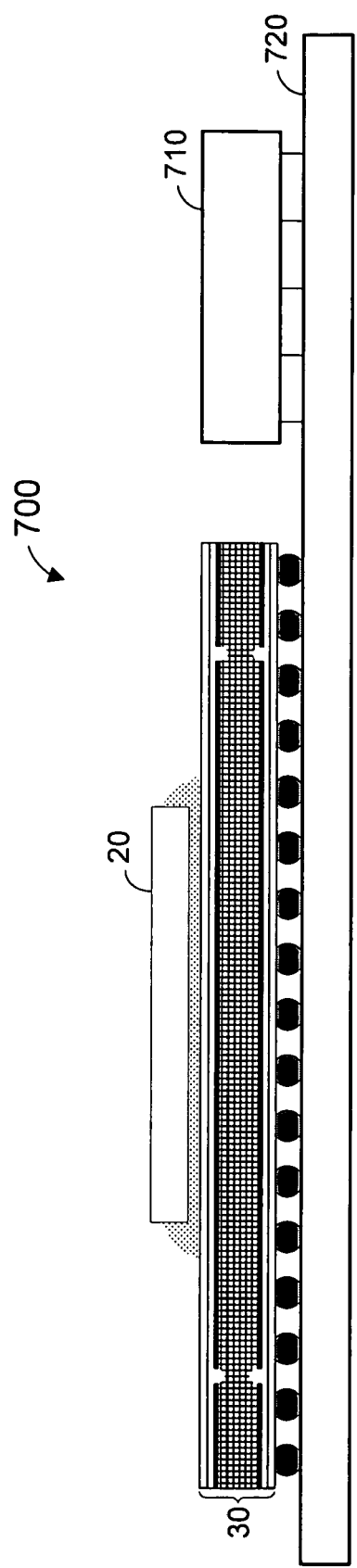
FIG. 7 is a diagram of a system according to some embodiments.

FIG. 7 is a cross-sectional side view of system 700 according to some embodiments. System 700 may comprise components of a server platform. System 700 includes die 20 and integrated circuit package substrate 30 as described above, memory 710 and motherboard 720.

Motherboard 720 may electrically couple memory 720 to die 20. More particularly, motherboard 720 may comprise a bus (not shown) that is electrically coupled to solder balls die 20 and to memory 710. Memory 710 may comprise any type of memory for storing data, such as a Single Data Rate Random Access Memory, a Double Data Rate Random Access Memory, or a Programmable Read Only Memory.

The several embodiments described herein are solely for the purpose of illustration. The various features described herein need not all be used together, and any one or more of those features may be incorporated in a single embodiment. Some embodiments may include any currently or hereafter-known versions of the elements described herein. Therefore, other embodiments may be practiced with various modifications and alterations.

What is claimed is:

1. An integrated circuit package comprising:
   a plurality of interconnects; and
   an integrated package substrate coupled to the plurality of interconnects and comprising an integrated circuit package substrate core,
   wherein a first surface of the integrated circuit package substrate core defines a depression entirely filled with a dielectric, wherein a second surface of the integrated circuit package substrate core defines a second depression entirely filled with the dielectric,
   wherein the second depression substantially mirrors the depression through the integrated circuit package substrate core,
   wherein the depression comprises an open end and a convex end, wherein the second depression comprises a second open end and a second convex end, and wherein the convex end is closer to the second convex end than to the second open end.

2. An integrated circuit package according to claim 1, wherein the integrated circuit package substrate core comprises an outer core layer and an inner core layer, and
   wherein the depression extends through the outer core layer and into the inner core layer.

3. An integrated circuit package according to claim 2, wherein the outer core layer comprises a metal, and
   wherein the inner core layer comprises a fiber-reinforced material.

4. An integrated circuit package according to claim 2, wherein the integrated circuit package substrate core further comprises a second outer core layer, wherein the inner core layer is disposed between the outer core layer and the second outer core layer, and
   wherein the second depression extends through the second outer core layer and into the inner core layer.

* * * * *